United States Patent
Higashi et al.

(10) Patent No.: US 9,865,483 B2
(45) Date of Patent: Jan. 9, 2018

(54) SUBSTRATE LIQUID PROCESSING METHOD, SUBSTRATE LIQUID PROCESSING APPARATUS, AND RECORDING MEDIUM

(71) Applicant: Tokyo Electron Limited, Tokyo (JP)

(72) Inventors: Hiroyuki Higashi, Kumamoto (JP); Gentaro Goshi, Kumamoto (JP); Takahisa Otsuka, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/851,388

(22) Filed: Sep. 11, 2015

(65) Prior Publication Data

US 2016/0093517 A1 Mar. 31, 2016

(30) Foreign Application Priority Data

Sep. 25, 2014 (JP) ................. 2014-195493

(51) Int. Cl.
*H01L 21/02* (2006.01)
*H01L 21/67* (2006.01)
*B08B 3/02* (2006.01)

(52) U.S. Cl.
CPC .......... *H01L 21/67051* (2013.01); *B08B 3/02* (2013.01); *H01L 21/02052* (2013.01)

(58) Field of Classification Search
None
See application file for complete search history.

(56) References Cited

U.S. PATENT DOCUMENTS

| | | |
|---|---|---|
| 5,021,924 A | 6/1991 | Kieda et al. |
| 2006/0286804 A1 | 12/2006 | Wu et al. |
| 2010/0031980 A1 | 2/2010 | Ito et al. |
| 2010/0203250 A1 | 8/2010 | Sato et al. |
| 2011/0200952 A1 | 8/2011 | Takiguchi et al. |
| 2012/0218531 A1 | 8/2012 | Hontake et al. |
| 2014/0261570 A1* | 9/2014 | Orii ............... H01L 21/02052 134/31 |

FOREIGN PATENT DOCUMENTS

| | | |
|---|---|---|
| JP | 2007-088381 A | 4/2007 |
| JP | 2009-059895 A | 3/2009 |

* cited by examiner

*Primary Examiner* — Michael Barr
*Assistant Examiner* — Jason Riggleman
(74) *Attorney, Agent, or Firm* — Abelman, Frayne & Schwab

(57) ABSTRACT

Disclosed is a substrate liquid processing method. The method includes: supplying a first processing liquid to a central portion of a substrate at a first flow rate by a first nozzle while rotating the substrate using a substrate holding unit; supplying a second processing liquid to a location between the central portion and an outer circumferential end of the substrate by a second nozzle while supplying the first processing liquid to the central portion of the substrate at the first flow rate; and changing the flow rate of the first processing liquid supplied from the first nozzle to a second flow rate lower than the first flow rate, so as to continue forming of the liquid film on the overall surface of the substrate while supplying the second processing liquid by the second nozzle to the substrate that is formed with a liquid film on the overall surface thereof.

12 Claims, 11 Drawing Sheets

SUBSTRATE LIQUID PROCESSING METHOD, SUBSTRATE LIQUID PROCESSING APPARATUS, AND RECORDING MEDIUM

CROSS-REFERENCE TO RELATED APPLICATIONS

This application is based on and claims priority from Japanese Patent Application No. 2014-195493, filed on Sep. 25, 2014, with the Japan Patent Office, the disclosure of which is incorporated herein in its entirety by reference.

TECHNICAL FIELD

The present disclosure relates to a technology that performs a liquid processing on a substrate by supplying a processing liquid to the substrate.

BACKGROUND

The most general method, which is employed when a liquid processing such as, for example, a chemical liquid processing or a rinse processing, is performed on a substrate such as, for example, a semiconductor wafer (hereinafter also referred to as a "wafer"), is to supply a processing liquid to the central portion of the substrate in a state where the substrate is horizontally placed and rotated around a vertical axis (see, e.g., Japanese Patent Laid Open Publication No. 2009-59895). In this case, the processing liquid, supplied to the central portion of the substrate, is diffused by centrifugal force, so that the overall surface of the substrate, including a processing target region in which the liquid processing is performed by the processing liquid, is covered with a liquid film of the processing liquid.

When a region, not covered with the processing liquid, is present on the surface of the substrate during the liquid processing, various problems may occur. For example, in the case of a chemical liquid processing, the processing becomes uneven. Further, when a rinse processing is performed on, for example, a patterned substrate with pure water such as, for example, deionized water (DIW), a processing liquid of a previous process (e.g., a chemical liquid) remains in the pattern, which may cause an insufficient rinse processing.

In order to cover the surface of the substrate with the processing liquid, it is affected by the rotation speed of the substrate and the flow rate of the processing liquid. A higher rotation speed of the substrate enables the liquid film of the processing liquid to easily spread. However, there is a scattering problem of the processing liquid (e.g., scattering of the processing liquid to the outside of a cup). In addition, a higher flow rate of the processing liquid enables the liquid film of the processing liquid to easily spread over the overall surface of the substrate. However, there is a problem of increasing the consumption of the processing liquid. What is requested is to cover the surface of the substrate with the liquid film without increasing the consumption of the processing liquid.

SUMMARY

According to an exemplary embodiment, the present disclosure provides a substrate liquid processing method. The method includes: supplying a first processing liquid to a central portion of a substrate at a first flow rate by a first nozzle while rotating the substrate using a substrate holding unit, the substrate holding unit being configured to horizontally hold the substrate and to rotate the substrate around a vertical axis; supplying a second processing liquid to a location between the central portion and an outer circumferential end of the substrate by a second nozzle while supplying the first processing liquid to the central portion of the substrate at the first flow rate; and changing the flow rate of the first processing liquid supplied from the first nozzle to a second flow rate that is lower than the first flow rate, so as to continue forming of the liquid film on the overall surface of the substrate while supplying the second processing liquid by the second nozzle to the substrate that is formed with a liquid film on the overall surface thereof.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
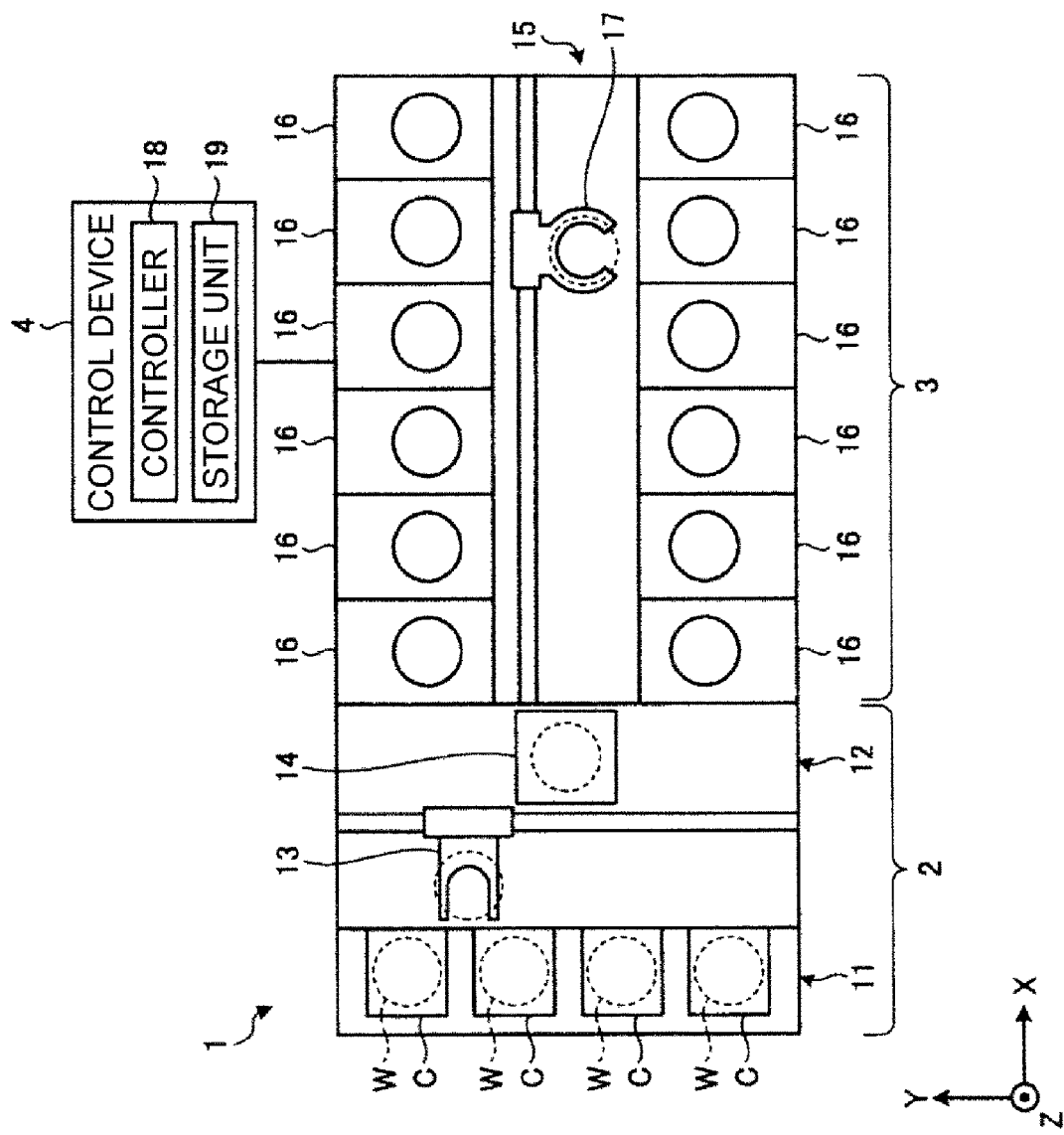
FIG. 1 is a plan view illustrating an outline of a substrate processing system including a processing unit according to an exemplary embodiment of the present disclosure.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

The present disclosure is to provide a technology which is capable of covering a processing target region of a substrate with a liquid film of a processing liquid using a smaller amount of the processing liquid.

A substrate liquid processing method of the present disclosure may include: supplying a first processing liquid to a central portion of a substrate at a first flow rate by a first nozzle while rotating the substrate using a substrate holding unit, the substrate holding unit being configured to horizontally hold the substrate and to rotate the substrate around a vertical axis; supplying a second processing liquid to a location between the central portion and an outer circumferential end of the substrate by a second nozzle while supplying the first processing liquid to the central portion of the substrate at the first flow rate; and changing the flow rate of the first processing liquid supplied from the first nozzle to a second flow rate that is lower than the first flow rate, so as to continue forming of the liquid film on the overall surface of the substrate while supplying the second processing liquid by the second nozzle to the substrate that is formed with a liquid film on the overall surface thereof.

In the substrate liquid processing method described as above, the first flow rate refers to a flow rate that enables the liquid film to be formed on the overall surface of the substrate in a state where the second processing liquid is not supplied, and the second flow rate refers to a flow rate that does not enable the liquid film to be formed on the overall surface of the substrate in a state where the second processing liquid is not supplied.

In the substrate liquid processing method described above, the supply position of the second processing liquid at a time of supplying the second processing liquid to the location between the central portion and the outer circumferential end of the substrate by the second nozzle while supplying the first processing liquid to the central portion of the substrate at the first flow rate is a position that causes the second processing liquid to cover an outer circumferential end of the liquid film formed when the first processing liquid is supplied to the substrate at the second flow rate under a condition in which the second processing liquid is not supplied to the substrate.

In the substrate liquid processing method described above, the second processing liquid is a liquid mixable with the first processing liquid.

In the substrate liquid processing method described above, the first processing liquid and the second processing liquid are pure water. The second processing liquid has a surface tension lower than that of the first processing liquid.

In the substrate liquid processing method described above, the first processing liquid is pure water, and the second processing liquid is isopropyl alcohol. The sum of the second flow rate and a supply flow rate of the second processing liquid is lower than the first flow rate.

In the substrate liquid processing method described above, the second processing liquid is supplied along a tangential direction of a rotation circle from an upstream side toward a downstream side of a rotation circle, the rotation circle rotating around the vertical axis in the same direction as the substrate, and the second processing liquid is supplied to the substrate such that an angle between the supply direction and the surface of the substrate is within a range of 5° to 15° when viewed from a lateral side.

In the substrate liquid processing method described above, the second processing liquid is supplied outwardly in a radial direction of the rotation circle and is supplied to the substrate such that an angle between the supply direction of the second processing liquid and the tangential direction is within a range of 0° to 45° when viewed from an upper side.

A substrate liquid processing apparatus of the present disclosure includes: a substrate holding unit configured to horizontally hold a substrate and to rotate the substrate around a vertical axis; a first nozzle configured to supply a first processing liquid to a central portion of the substrate held by the substrate holding unit; a second nozzle configured to supply a second processing liquid to a location between the central portion and a circumferential end of the substrate; and a controller configured to control supply initiation and stop of the first processing liquid from the first nozzle and the supply initiation and stop of the second processing liquid from the second nozzle. The controller is configured to execute the supply of the first processing liquid from the first nozzle to the central portion of the rotating substrate at a first flow rate and the supply of the second processing liquid from the second nozzle, and to execute change of a supply flow rate of the first processing liquid, from the first nozzle to the central portion of the substrate, into a second flow rate that is lower than the first flow rate while supplying the second processing liquid to the substrate that is formed with a liquid film on the overall surface.

The present disclosure forms a liquid film in a processing target region of a substrate with a first processing liquid, and then supplies a second processing liquid to the peripheral portion of the substrate. Thus, the tendency of the liquid film to contract by a surface tension can be suppressed. As a result, even if the supply flow rate of the first processing liquid is reduced to a second flow rate which is lower than a first flow rate that enables the first processing liquid to form the liquid film alone on the processing target region, the liquid processing of the substrate is performed while maintaining the state in which the liquid film covers the processing target region. Thus, particles on the surface of the substrate can be reduced.

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and a processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the liquid processing system 1 is provided with a control device 4. The control device 4 is, for example, a computer, and includes a controller 18 and a storage unit 19. The storage unit 19 stores a program that controls various processings performed in the liquid processing system 1. The controller 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the transfer unit 14. The wafer W placed on the transfer unit 14 is taken out from the transfer unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
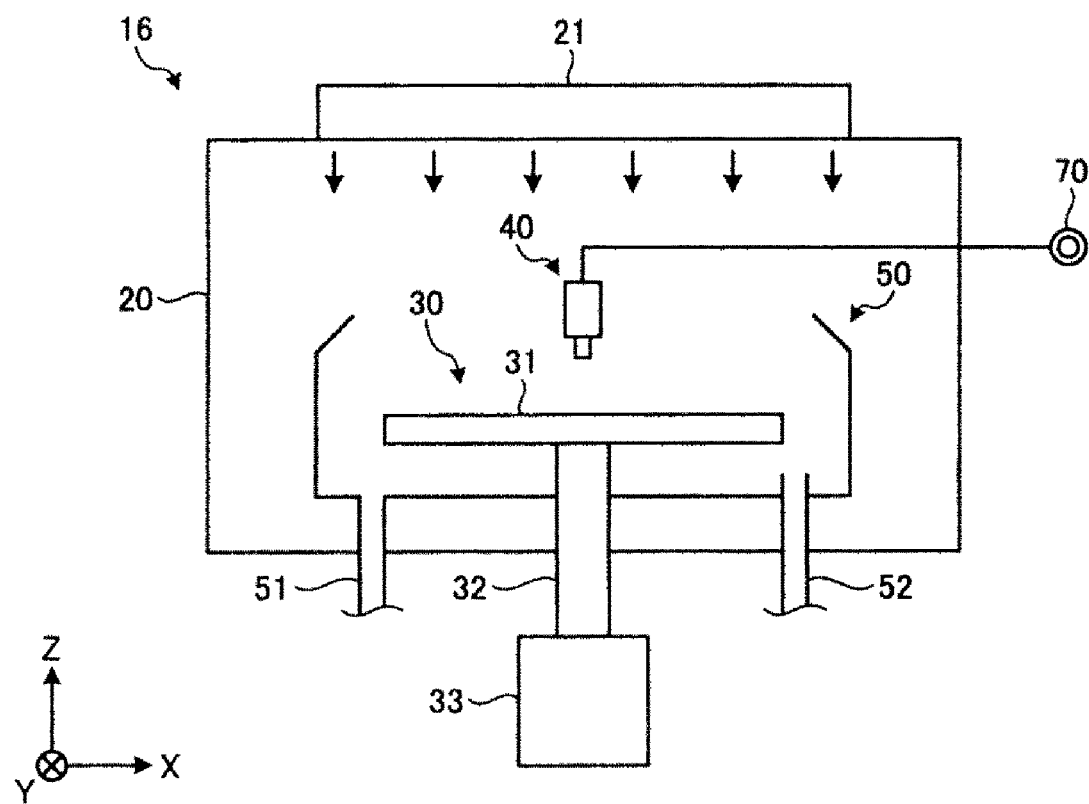
FIG. 2 is a vertical-sectional side view illustrating an outline of the processing unit.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside.

The processing unit 16, of which the outline configuration has been described above, corresponds to a substrate liquid processing apparatus of the present disclosure. For example, the processing fluid supply unit 40, provided in the processing unit 16 as described above, supplies, as a processing fluid, a diluted hydrofluoric acid (DHF) for removing a natural oxide on the surface of the wafer W. Subsequently, DIW (first processing liquid) serving as a rinse liquid is supplied to perform a rinse processing of the wafer W. Further, the processing unit 16 is provided with a second processing liquid supply unit 60 configured to perform the supply of DIW (second processing liquid) serving as an assistant processing liquid (hereinafter, also referred to as an "assistant liquid") so as to maintain the state of the liquid film of the rinse liquid formed over the overall surface of the wafer W during the rinsing.

Hereinafter, detailed configurations of the processing fluid supply unit 40 and the second processing liquid supply unit 60 will be described with reference to FIGS. 3 to 7.

Figure 3:
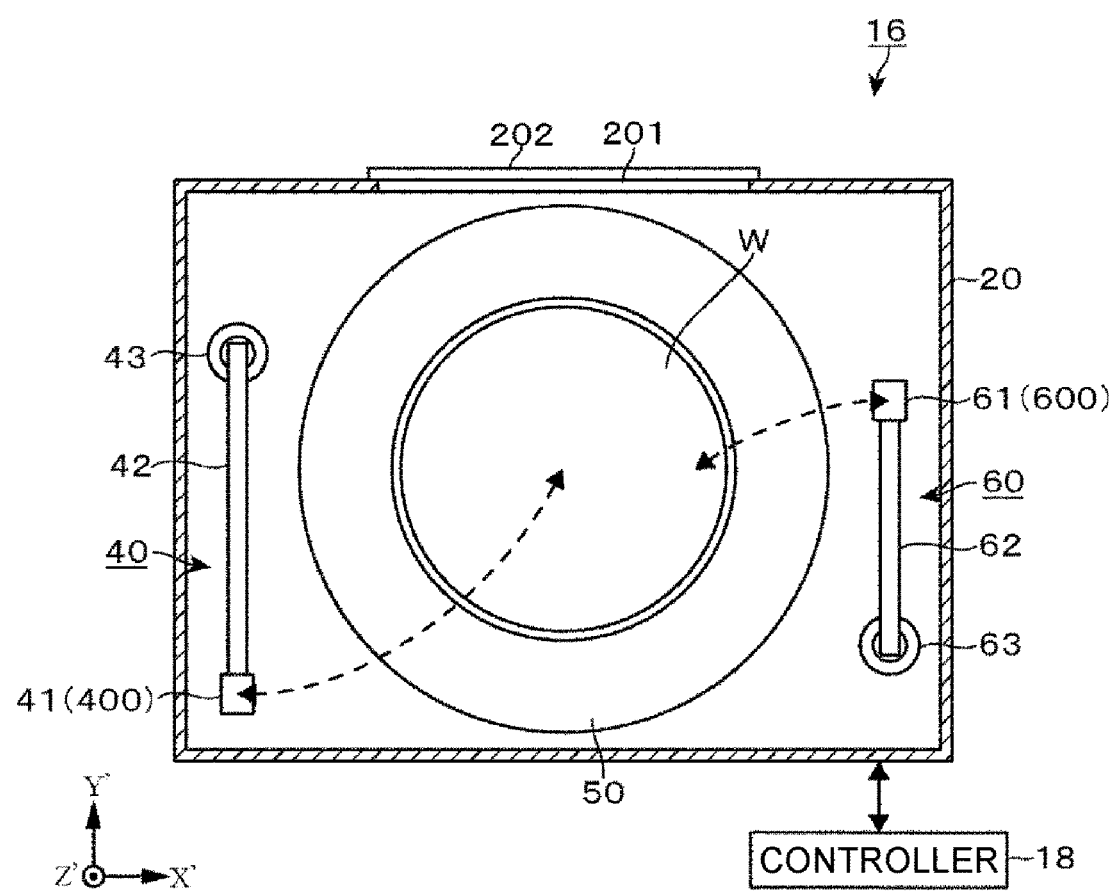
FIG. 3 is a plan view of the processing unit.

As illustrated in FIG. 3, the processing unit 16 is provided with the processing fluid supply unit 40 and the second processing liquid supply unit 60 within the chamber 20 in which the recovery cup 50 is provided. The processing unit 16 performs a processing of the wafer W that is carried into the chamber 20 through a carry-in/out port 201. The carry-in/out port 201 is opened or closed by a shutter 202.

Figure 4:
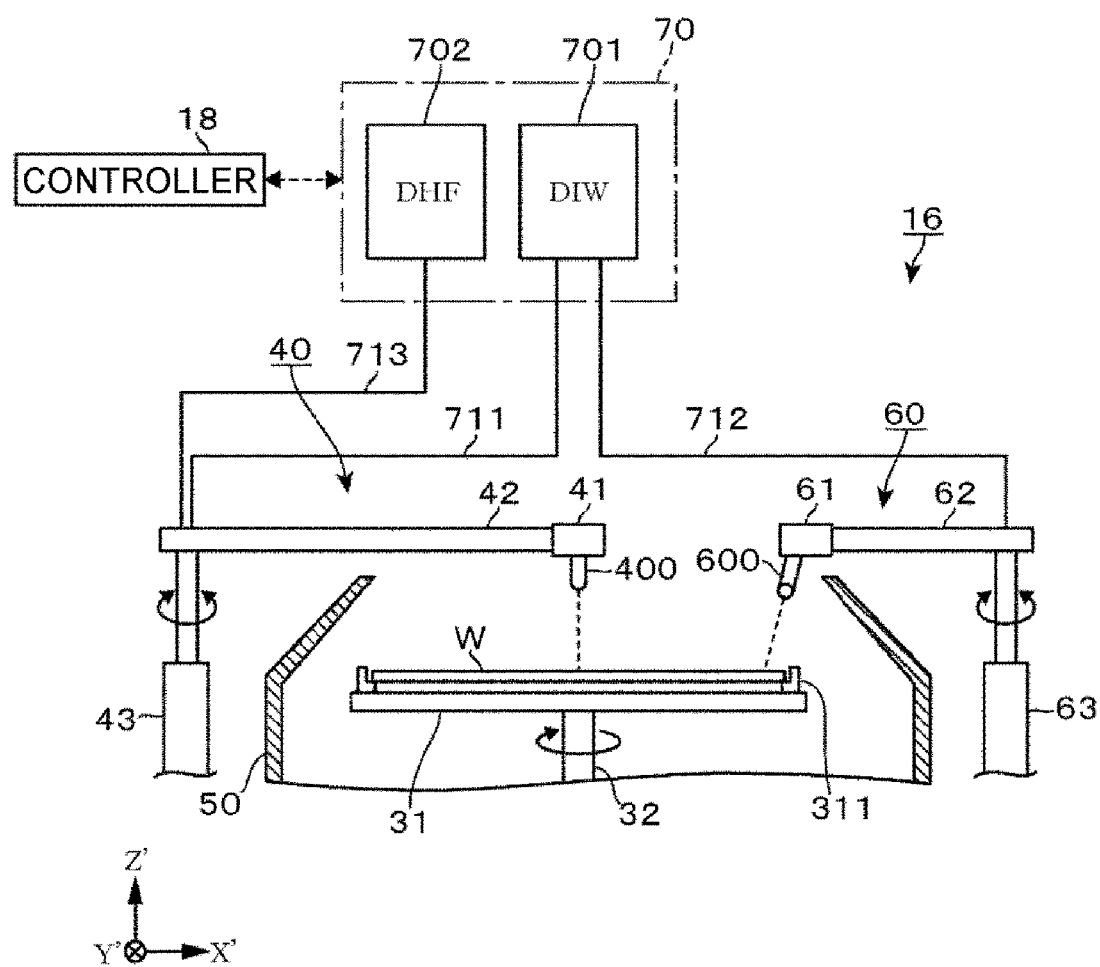
FIG. 4 is a vertical-sectional side view illustrating the processing unit together with first and second nozzles.
Figure 5:
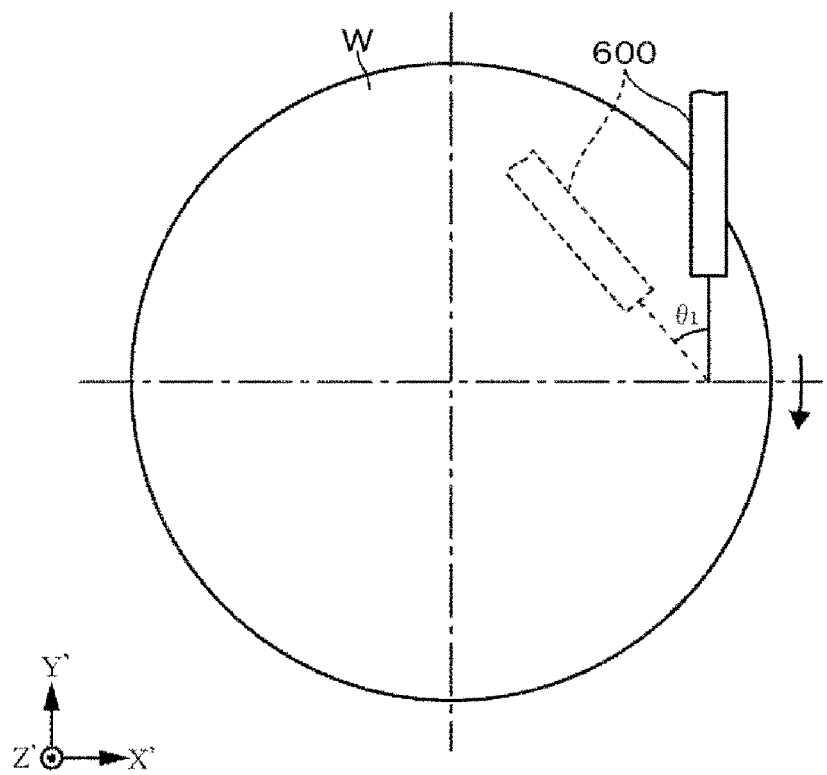
FIG. 5 is a plan view illustrating a placed state of a second nozzle in relation to a wafer.

As described above with reference to FIG. 1, the plurality of processing units 16, arranged at both sides of the transfer section 15, are disposed such that the carry-in/out ports 201 of the respective processing units 16 face the transfer section 15. In FIGS. 3 to 5, the X'-axis, Y'-axis, and Z'-axis are newly used so as to represent directions in each processing unit 16. Assuming that the direction, in which the carry-in/out port 201 is provided, is the front side in the Y'-axis direction, and the X'-axis and Z'-axis that are orthogonal to the Y'-axis are defined. Further, the positive Z'-axis direction is regarded as a vertically upward direction.

As illustrated in FIGS. 3 and 4, the processing fluid supply unit 40 includes a nozzle head 41 provided with a first nozzle 400, a nozzle arm 42 having a tip end portion to which the nozzle head 41 is attached, and a rotation driving unit 43 configured to support a base end portion of the nozzle arm 42 and to horizontally rotate the nozzle arm 42 about the base end portion as a rotation axis. The rotation driving unit 43 moves the first nozzle 400 between a processing position that is set above the central portion of the wafer W to supply DHF or a rinse liquid to the wafer W (see, e.g., FIG. 4), and a retracted position that is retracted toward the lateral side of the recovery cup 50 (see, e.g., FIG. 3).

Further, the rotation driving unit 43 vertically moves the nozzle arm 42 between a height position at the time of rotating the nozzle arm 42 and a lower height position for supplying the processing fluid (DHF or rinse liquid) to the wafer W.

The nozzle arm 42 is provided with supply pipes connected to the first nozzle 400 (e.g., a tip end side supply pipe 401 and a base end side supply pipe 403 to be described below), and these supply pipes 401 and 403 are connected to a rinse liquid supply path 711 and a DHF supply path 713. The supply paths 711 and 713 are connected to a DIW source 701 and a DHF source 702, respectively, and the DIW source 701 and the DHF source 702 constitute the processing fluid source 70 described above. Each of the DIW source 701 and the DHF source 702 is provided with, for example, a reservoir of the processing fluid, pump, flow-rate regulation valve, or opening/closing valve, and supplies each processing fluid to the first nozzle 400 in response to a control signal from the controller 18. The flow rate of DHF is regulated by the flow rate regulation valve connected to the DHF supply path 713, and the flow rate of DIW supplied from the first nozzle 400 is regulated by the flow rate regulation valve connected to the rinse liquid supply path 711. Supply initiation or stop is executed as the opening/closing valve is opened or closed.

Figure 7:
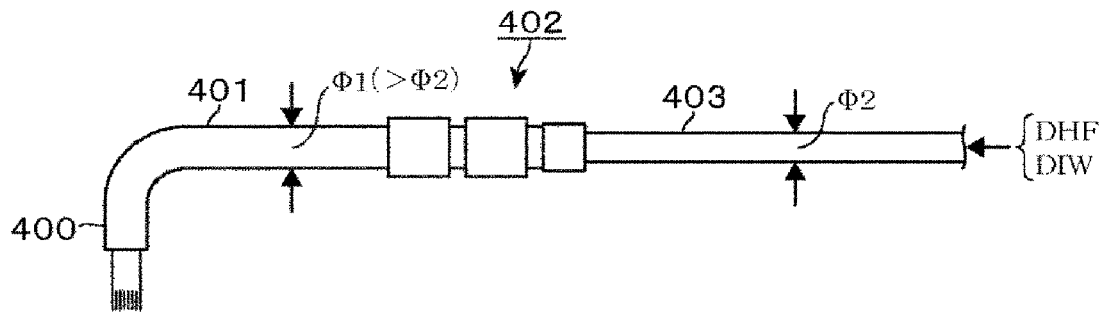
FIG. 7 is an enlarged view illustrating a configuration of a first nozzle.

Here, as illustrated in FIG. 7, the supply pipes 401 and 403 installed to the nozzle arm 42 is different in pipe diameter between the tip end side supply pipe 401 and the base end side supply pipe 403 with a central joint 402 being interposed therebetween. The base end side supply pipe 403 has a relatively small diameter. For example, the base end side supply pipe 403 has an inner diameter $\Phi 2$ of 4 mm. On the other hand, the tip end side supply pipe 401 provided with the first nozzle 400 has a relatively large diameter. For example, the tip end side supply pipe 401 has an inner diameter $\Phi 1$ of 6 mm.

When the processing fluid (DHF or rinse liquid) supplied to the center of the wafer W is applied to the surface of the wafer W, liquid splash is likely to occur. In order to prevent the occurrence of liquid splash, the pipe diameters of the supply pipes of the processing fluid may be increased so as to reduce the flow rate of the processing fluid and to reduce the collision force at the time of applying the processing fluid to the wafer W. However, in the case where the pipe diameters of all the supply pipes connected to the first nozzle 400 are increase, the amount of the processing fluid held inside the supply pipes is increased. As a result, when the supply of the processing fluid is stopped by an opening/closing valve (not illustrated), an inertial force applied to the processing fluid remaining downstream of the opening/closing valve increases so that a so-called dropping phenomenon in which the processing fluid from the first nozzle 400 drops at an unintended position is likely to occur.

Therefore, in the present embodiment, the pipe diameter from the tip end side supply pipe 401 that is close to the first nozzle 400, to the tip end of the first nozzle 400 is increased so as to reduce the collision force at the time of applying the processing fluid to the wafer W is reduced, and the pipe diameter of the base end side supply pipe 403 is reduced so as to the increase of the amount of the processing fluid held in the supply pipes 401 and 403. As a result, the occurrence of dropping from the first nozzle 400 is suppressed while suppressing the occurrence of liquid splash at the time of supplying the processing fluid to the wafer W.

Here, in order to reduce the flow rate at the time of ejecting the processing fluid, it is considered that it may be sufficient if the inner diameter of the first nozzle 400. However, in this case, liquid splash is likely occur at the time of applying the processing liquid to the wafer because the flow of the processing liquid is disturbed in an inner diameter varying portion and the processing liquid is ejected in the disturbed state. In order to suppress the occurrence of liquid splash, the pipe diameter of the horizontal portion upstream of the first nozzle 400 may be increased, as illustrated in FIG. 7.

In addition, although FIG. 4 illustrates only one first nozzle 400, the nozzle head 41 may be provided with two first nozzles 400 that separately supply the DHF and the rinse liquid, and the first nozzles 400 may be connected to the rinse liquid supply path 711 and the DHF supply path 713 through the tip end side supply pipe 401 and the base end side supply pipe 403, respectively.

As illustrated in FIGS. 3 and 4, the second processing liquid supply unit 60, which performs the supply of the assistant liquid, is located, for example, at a position opposite to the processing fluid supply unit 40 with the recovery cup 50 being interposed therebetween when viewed from the carry-in/out port 201 through which the carry-in/out of the wafer W is performed with respect to the chamber 20.

The second processing liquid supply unit 60 includes a nozzle head 61 provided with a second nozzle 600, a nozzle arm 62 having a tip end portion attached to the nozzle head 61, and a rotation driving unit 63 configured to support a base end portion of the nozzle arm 62 and to execute the horizontal rotation of the nozzle arm 62 about the base end portion as a rotation axis and the vertical movement of the nozzle arm 62.

The rotation driving unit 63 moves the second nozzle 600 between a processing position that is set above the peripheral portion of the wafer W so as to supply the assistant liquid to the peripheral portion of the wafer W that is being subjected to the rinse processing (see, e.g., FIG. 4) and a retracted position that is retracted toward the lateral side of the recovery cup 50 (see, e.g., FIG. 3). In addition, the rotation driving unit 63 lowers the second nozzle 60, which has been moved to the processing position, from a height position at the time of rotation to a height position at the time of supplying the assistant liquid to the wafer W by the lifting operation of the nozzle arm 62.

Figure 6:
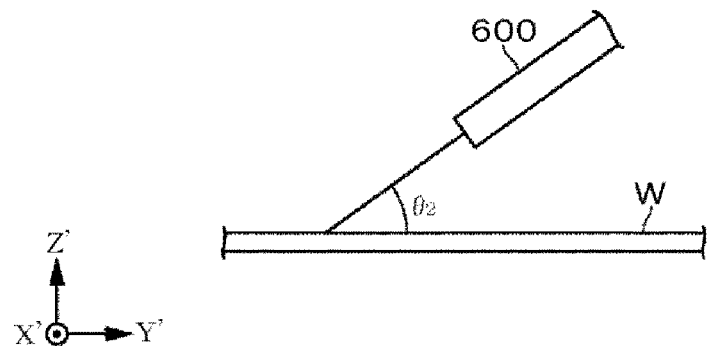
FIG. 6 is a side view illustrating the placed state of the second nozzle in relation to the wafer.

FIGS. 5 and 6 illustrate a placed state of the second nozzle 600 attached to the nozzle head 61, i.e. the direction of ejecting/supplying the assistant liquid from the second nozzle 600. The second nozzle 600 is placed to eject the assistant liquid along a tangential direction of the wafer W from the upstream side to the downstream side of the circular wafer W (rotation circle) which is rotated around the vertical axis (see the second nozzle 600 represented by the solid line in FIG. 5), or to eject the assistant liquid from the inside to the outside of the wafer W in the radial direction of the wafer W (see the second nozzle 600 represented by the dashed line in FIG. 5).

In addition, as illustrated in FIG. 5, the angle $\theta_1$ between the ejection direction of the assistant liquid and the tangential direction of the wafer W is set to be in a range of 0° to 45° when viewed from the top of the wafer W.

In addition, as illustrated in FIG. 6, the angle $\theta_2$ between the ejection direction of the assistant liquid and the surface of the wafer W when viewed from a lateral side of the wafer W (FIG. 5 illustrates a state in which the second nozzle 600 is viewed from a position at which the second processing liquid supply unit 60 is placed) is set to be in a range of 5° to 15°.

The nozzle arm 62 is provided with a supply pipe (not illustrated) connected to the second nozzle 600, and the base end portion of the nozzle arm 62 is connected to an assistant liquid supply path 712 (FIG. 4). The assistant liquid supply path 712 is connected to the DIW source 701 described above, and DIW, which is the assistant liquid, is supplied to the second nozzle 600 in response to a control signal from the controller 18. The DIW source 701 is provided with, for example, a reservoir of the processing fluid to be supplied to the second nozzle 600, a pump, a low-rate regulation valve, or an opening/closing valve, and supplies the processing fluid to the second nozzle 600 in response to a control signal from the controller 18. The flow rate of the processing fluid supplied from the second nozzle 600 is regulated by a flow-rate regulation valve connected to the assistant liquid supply path 712, and supply initiation or stop is executed by a control signal from the controller 18.

The actions of the processing unit 16 having the above-described configuration will be described using the flowchart of FIG. 8, the operational views of FIGS. 9 to 11, and the conceptual views of FIGS. 12 and 13.

After a processing target object, for example, a wafer W having a diameter of 300 mm is transferred into the transfer section 15 by the substrate transfer device 17 and then carried into the processing unit 16 configured to a processing on the wafer W, through the carry-in/out port 201, the wafer W is delivered to a holding pin 311 on the holding unit 31. When the substrate transfer device 17 delivers the wafer W and then is retracted from the processing unit 16, the carry-in/out port 201 is closed by the shutter 202.

Subsequently, the first nozzle 400, which is located at the retracted position, is moved to the processing position above the central portion of the wafer W, and the wafer W is rotated about the vertical axis. Once the wafer W has reached a predetermined rotation speed, a predetermined amount of DHF is supplied from the first nozzle 400 to the wafer W. The DHF, applied to the surface of the wafer W, spreads over the surface by the action of centrifugal force so as to cover the overall surface of the wafer W. As a result, the DHF is supplied to the overall surface of the wafer W including a processing target region (e.g., a semiconductor device forming region) so that a liquid processing to remove a natural oxide from the surface of the wafer W is executed. Then, once the supply of the DHF has been performed for a predetermined time period, the supply of the DHF from the first nozzle 400 is stopped.

Subsequently, a processing fluid to be supplied from the first nozzle 400 is switched into a rinse liquid (DIW) so as to perform a rinse processing on the wafer W. The processing unit 16 of the present exemplary embodiment supplies the assistant liquid (DIW) from the second nozzle 600 during the rinse processing so that the supply amount of the rinse liquid from the first nozzle 400 is reduced and maintains a state in which a liquid film of the rinse liquid is formed on the overall surface of the wafer W.

The operation of the rinse processing is described with reference to FIGS. 8 and 9 to 11. When the liquid processing using the DHF is terminated, the second processing liquid supply unit 60 moves the second nozzle 600 toward a position above the peripheral portion of the wafer W where the supply of the assistant liquid is performed. The peripheral portion refers to a portion positioned between the center of the wafer W and a circumferential end of the wafer W. In addition, the substrate holding mechanism 30 (substrate holding unit) adjusts the rotation speed of the wafer W to the rotation speed at the time of performing the rinse processing to be in a range of, for example, 500 rpm to 1500 rpm (START).

Figure 8:
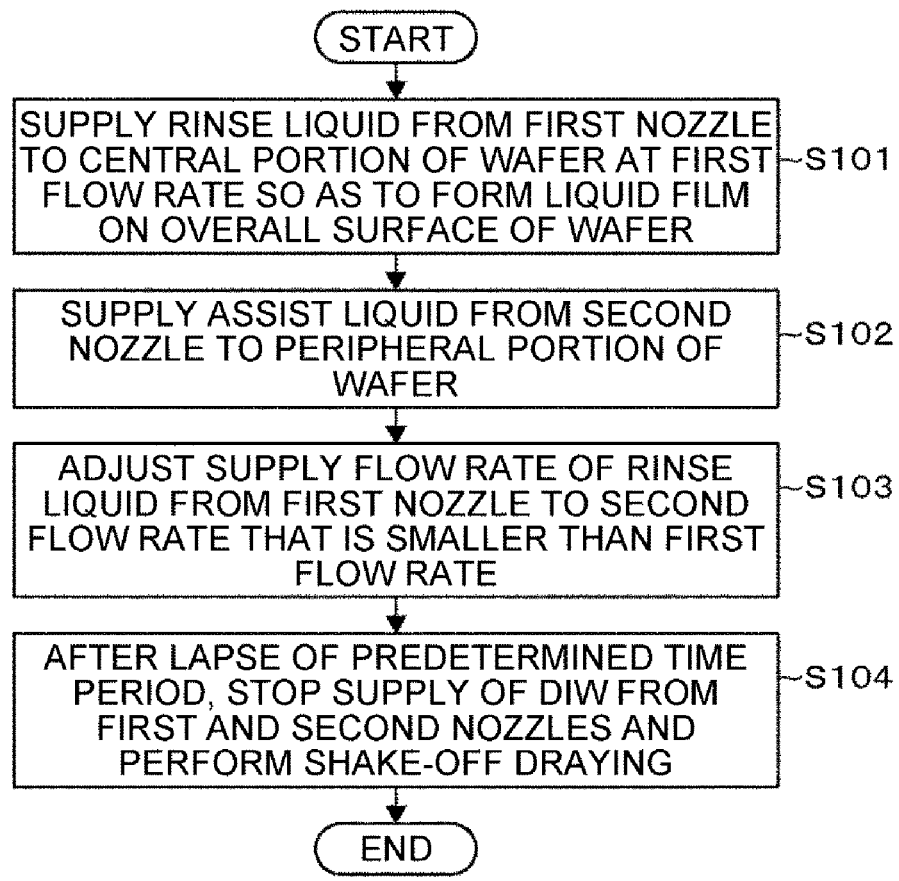
FIG. 8 is a flowchart illustrating a flow of a liquid processing operation using the first and second nozzles.
Figure 9:
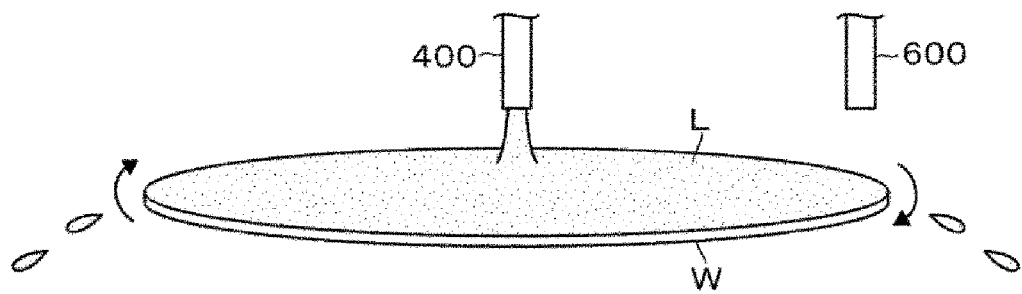
FIG. 9 is a first explanatory view illustrating the liquid processing operation.

When the movement of the second nozzle 600 and the adjustment in the rate of rotation of the wafer W are terminated, the rinse liquid is supplied from the first nozzle 400 to the central portion of the wafer W at a first flow rate in a range of, for example, 2.0 l/min to 2.5 l/min (step S101 of FIG. 8 and FIG. 9). Here, the first flow rate is set to a flow rate that enables a liquid film L to be formed on the overall surface of the wafer W when the rinse liquid is supplied alone from the first nozzle 400. Accordingly, the liquid film L of the rinse liquid is formed on the overall surface of the wafer W including the processing target region. In addition, in the exemplary embodiment illustrated in FIG. 9, the supply of the assistant liquid from the second nozzle 600 is not performed at this time.

Subsequently, while the supply of the rinse liquid from the first nozzle 400 is performed at the first flow rate, the supply of the assistant liquid is initiated from the second nozzle 600 to the peripheral portion of the wafer W at a flow rate in a range of, for example, 0.1 l/min to 0.5 l/min (step S102 of FIG. 8, and FIG. 10). The assistant liquid supplied from the second nozzle 600 joins the liquid film L of the rinse liquid at the peripheral portion of the wafer W, thereby forming a portion of the liquid film L that covers the wafer W together with the rinse liquid.

Here, as described above with reference to FIGS. 5 and 6, as the second nozzle 600 is obliquely disposed to be directed from the upstream side to the downstream side in the rotation direction of the wafer W, the consumption of the assistant liquid may be reduced. In addition, the occurrence of liquid splash may be suppressed when the assistant liquid joins the liquid film L of the rinse liquid formed on the surface of the wafer W. As a result, it is possible to suppress the generation of particles which is caused when mist of the rinse liquid generated by liquid splash is attached to the wafer W during drying.

Figure 10:
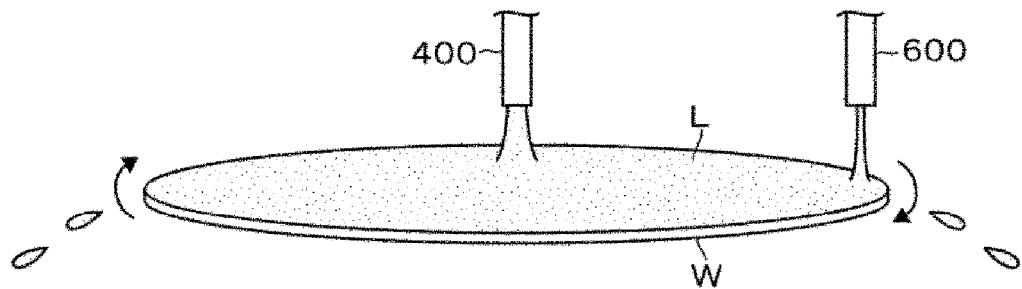
FIG. 10 is a second explanatory view illustrating the liquid processing operation.

In addition, although steps S101 and S102 of FIG. 8 and FIGS. 9 and 10 illustrate an example in which the supply of the rinse liquid from the first nozzle 400 is followed by the supply of the assistant liquid from the second nozzle 600 in order to clarify the actions of the first nozzle 400 and the second nozzle 600, the supply of the rinse liquid and the supply of the assistant liquid may be simultaneously initiated. In addition, the case where the supply of each liquid is initiated in the sequence of first initiating the supply of the assistant liquid and, thereafter, performing the supply of the rinse liquid is not excluded.

Figure 11:
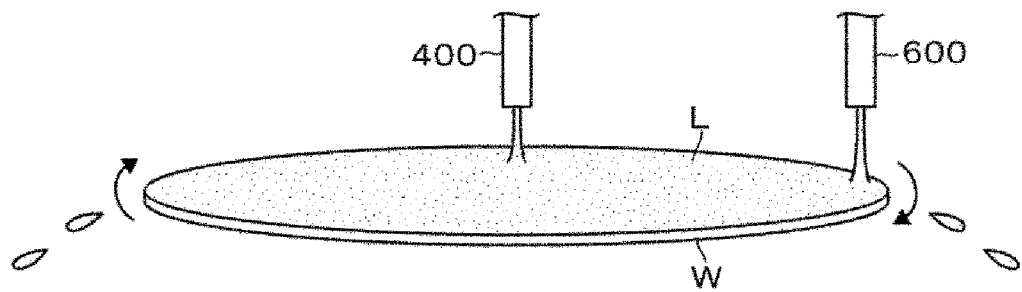
FIG. 11 is a third explanatory view illustrating the liquid processing operation.

When the supply of the assistant liquid is performed from the second nozzle 600 and the flow of the liquid is stabilized on the surface of the wafer W, the flow rate of the rinse liquid supplied from the first nozzle 400 is adjusted to a second flow rate in a range of, for example, 1.0 l/min to 1.5 l/min, which is lower than the first flow rate described above while the supply of the assistant liquid from the second nozzle 600 is continued (step S103 of FIG. 8, and FIG. 11). Here, the second flow rate is set to a flow rate that is capable of maintaining the liquid film L formed on the overall surface of the wafer W under the condition in which no assistant liquid is supplied from the second nozzle 600. Further, the second flow rate also refers to a flow rate that is not capable of maintaining the liquid film L formed on the overall surface of the wafer W by the influence of a surface tension applied to the rinse liquid under the condition in which no assistant liquid is supplied from the second nozzle 600.

Here, the actions of the assistant liquid will be described with reference to FIGS. 12 and 13. FIG. 12 illustrates the state of the liquid film L of the rinse liquid in a case where the rinse liquid is supplied from the first nozzle 400 at the second flow rate $F_2$ under the condition in which the supply of the assistant liquid is not performed. To a point P at an outer circumferential end position of the liquid film L (designated by "f" in FIG. 12), for example, the centrifugal force of the rotating wafer W or the force of the rinse liquid at the center side of the wafer W to push out the rinse liquid at the peripheral side of the wafer W is applied. The force is applied toward the outside in the radial direction of the wafer W and tends to cause the liquid film L to spread outward.

Meanwhile, at the point P, the horizontal components of a surface tension $\gamma_1$ acting between the rinse liquid and the surface of the wafer W and a surface tension $\gamma_2$ acting between the rinse liquid and the surrounding atmosphere (air) are applied inwardly in the radial direction of the wafer W. These forces act inwardly in the radial direction of the wafer W, causing the liquid film L to be accumulated to a small size at the central portion of the wafer W.

The diameter of the liquid film L on the surface of the wafer W is determined by the balance of the aforementioned forces. In addition, the surplus rinse liquid is cut off from the liquid film L to become liquid droplets, which flow to the outer circumference of the wafer W and, thereafter, are scattered off from the wafer W.

Figure 12:
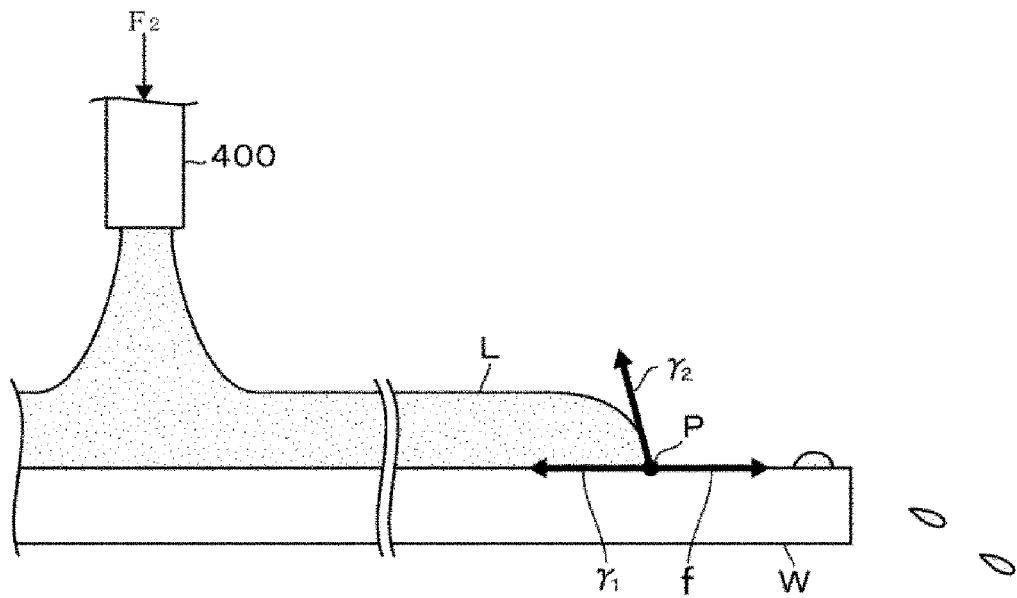
FIG. 12 is an explanatory view illustrating the state of a liquid film formed on the surface of a wafer.
Figure 13:
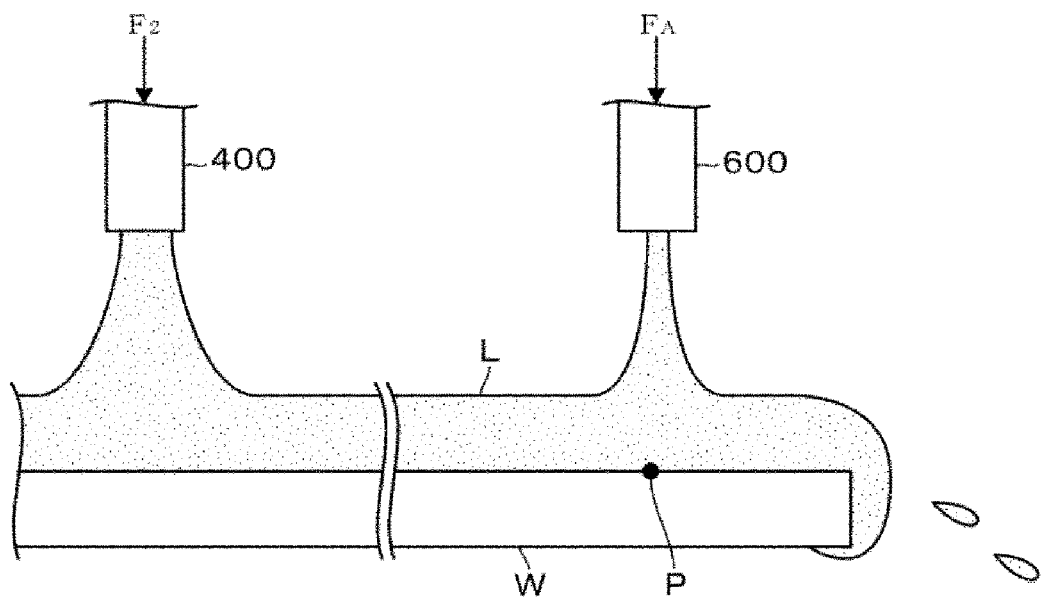
FIG. 13 is an explanatory view illustrating the action of an assistant liquid supplied from the second nozzle.

As in the example illustrated in FIG. 12, when a region where the surface of the wafer W is not covered with the liquid film L is generated, a sufficient rinse processing is not performed in an in-plane processing target region of the wafer W. As a result, the components of the DHF remain on the surface of the wafer W, which causes the generation of particles.

Therefore, in order to form the liquid film L of the rinse liquid on the overall surface of the wafer W using only the first nozzle 400 from the state of FIG. 12, it is necessary to cause the liquid film L to spread by increasing the rotation speed of the wafer W or the supply flow rate of the rinse liquid. However, increasing the rate of rotation of the wafer W has a risk of scattering of the rinse liquid, and increasing the supply flow rate of the rinse liquid increases the consumption of the rinse liquid.

Therefore, the processing unit 16 of the present embodiment may cover the point P with the liquid film L by supplying the assistant liquid from the second nozzle 600 to the peripheral portion of the wafer W so as to place the point P in the state where no surface tension is applied thereto. As a result, the overall surface of the wafer W may be covered with the liquid film L of the rinse liquid at the second flow rate $F_2$, which is lower than the first flow rate $F_1$ at which the first nozzle 400 is capable of forming the liquid film L alone on the overall surface of the wafer W.

Here, a liquid mixable with the rinse liquid may be used as the assistant liquid. When DIW is used as the assistant liquid, this requirement is satisfied because the DIWs are mixable with each other.

In addition, the supply flow rate $F_A$ of the assistant liquid is not specially limited so long as it can maintain the state in which the liquid film L is formed on the overall surface of the wafer W when the flow rate of the rinse liquid supplied from the first nozzle 400 is reduced from the first flow rate $F_1$ to the second flow rate $F_2$. However, in view of reducing the consumption of DIW, the sum of the flow rate of the assistant liquid and the second flow rate may be set to be lower than the first flow rate ($F_A+F_2<F_1$).

In addition, like the above-described ranges of the supply flow rates of the rinse liquid and the assistant liquid (the first flow rate $F_1$=2.0 l/min to 2.5 l/min, the second flow rate $F_2$=1.0 l/min to 1.5 l/min, and the supply flow rate of the assistant liquid $F_A$=0.1 l/min to 0.5 l/min at the rate of rotation of the wafer W of 500 rpm to 1500 rpm), in practice, it is confirmed through tests that the state of the liquid film L formed on the overall surface of the wafer W may be maintained by using the supply flow rate of the assistant liquid lower than the second flow rate while satisfying the requirement of $F_A+F_2<F_1$ (see test results to be described below).

Returning to the description of the processing of the wafer W, when the rinse processing of the overall surface of the wafer W is completed by the lapse of a predetermined time period after the flow rate of the rinse liquid supplied from the first nozzle 400 is adjusted to the second flow rate, the supply of the rinse liquid and assistant liquid from the first and second nozzles 400 and 600 is stopped. Then, the rotation of the wafer W is continued so as to shake off the liquid remaining on the surface of the wafer W so as to dry the wafer W (step S104 of FIG. 8). At this time, in order to prevent liquid droplets from remaining on the surface of the wafer W, a liquid solvent such as, for example, isopropyl alcohol (IPA) may be supplied as a liquid for a drying processing.

Once the wafer W has been dried, rotation of the wafer W is stopped, the substrate transfer device 17 is introduced from the carry-in/out port 201, receives the wafer W from the substrate holding mechanism 30, and then carries out the processed wafer W from the processing unit 16 (END).

The processing unit 16 according to the present embodiment has the following effects. The action of the liquid film L to contract by a surface tension is suppressed as the assistant liquid (second processing liquid) is supplied from the second nozzle 600 to the peripheral portion of the liquid film L formed by the rinse liquid (first processing liquid) supplied from the first nozzle 400. As a result, the state of the liquid film L that covers the overall surface of the wafer W may be maintained even if the supply flow rate of the rinse liquid is reduced to the second flow rate that is lower than the first flow rate that enables the rinse liquid from the first nozzle 400 to form the liquid film L alone on the overall surface of the wafer W. As a result, it is possible to suppress the generation of particles caused when a sufficient rinse processing is not performed.

Since the sum of the supply amounts of the rinse liquid and assistant liquid at the second flow rate is lower than the first flow rate, the scattering of the rinse liquid (e.g., scattering to the outside of the cup) may be suppressed.

Here, the processing liquid (first processing liquid) used in the liquid processing according to the present disclosure that reduces the flow rate required to form the liquid film L on the overall surface of the wafer W from the first flow rate to the second flow rate using the assistant liquid, is not limited to the rinse liquid. For example, the present disclosure may also be applied to a liquid processing that uses, as the first processing liquid, any of various chemical liquids such as, for example, an SC1 liquid (a mixture of ammonia water and oxygenated water) which is an alkali chemical liquid so as to remove particles or organic contaminants on the surface of a wafer W or an SC2 liquid (a mixture of hydrochloric acid, oxygenated water, and pure water), besides the above-described DHF. In addition, the rinse liquid is not limited to the DIW. For example, ammonia water, ozone water, or aerated water may be used.

Figure 14:
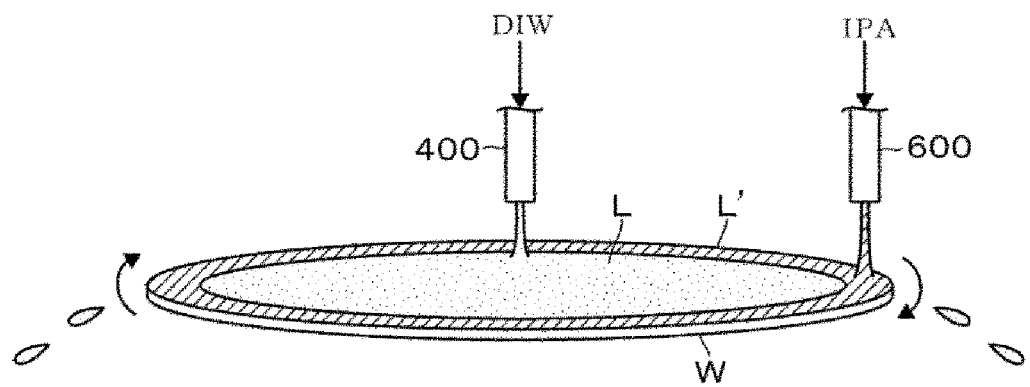
FIG. 14 is an explanatory view illustrating a liquid processing operation according to another exemplary embodiment.

In addition, a liquid other than the DIW may be used as the second processing liquid which is used as the assistant liquid. For example, FIG. 14 illustrates an example in which IPA is supplied as the second processing liquid from the second nozzle 600 when the first processing liquid supplied from the first nozzle 400 is DIW. IPA is mixable with DIW. In addition, IPA has a surface tension lower than that of DIW. Therefore, even if the supply position of the second nozzle 600 is brought closer to the central portion, the state of the liquid film L that covers the overall surface of the wafer W can be maintained. Even if the flow rate of the rinse liquid supplied from the first nozzle 400 is set to be lower than the second flow rate, the state of the liquid film L that covers the overall surface of the wafer W can be maintained. Accordingly, the processing target region of the substrate can be covered with the liquid film of the processing liquid with a smaller consumption of the processing liquid compared to that of DIW.

Figure 15:
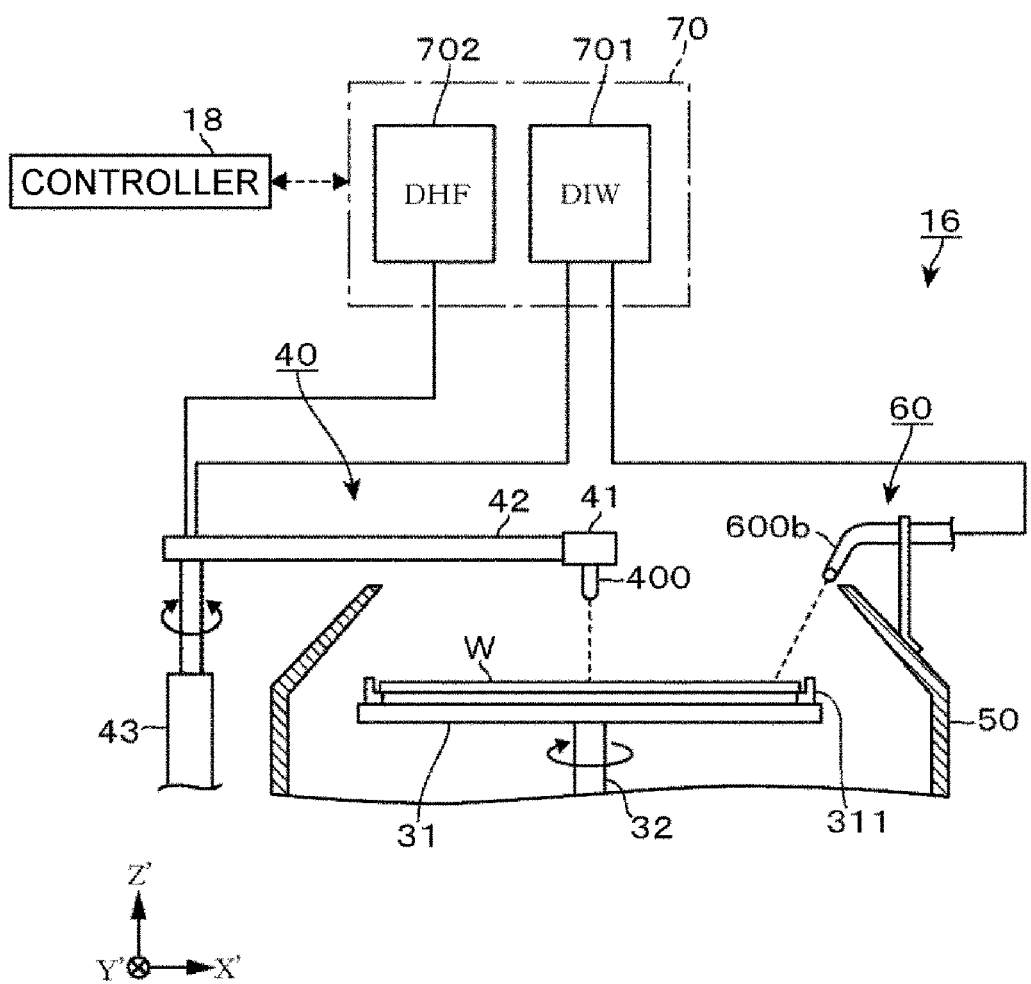
FIG. 15 is a vertical-sectional side view illustrating another exemplary configuration of the processing unit.

In addition, the second nozzle 600, which performs the supply of the assistant liquid, is not limited to the case where the second nozzle 600 is configured to be provided at the tip end portion of the nozzle arm 62 which performs rotation and movement such that the second nozzle 600 is movable between a processing position and a retracted position. For example, as illustrated in FIG. 15, a second nozzle 600b may be fixedly placed within the processing unit 16. In the example of FIG. 15, the second nozzle 600b is fixed at a position near the opening of the top surface of the recovery cup 50.

In addition, the second nozzle 600 (600b) is not limited to the case where the assistant liquid is supplied to only one location at the peripheral portion of the wafer W. For example, a plurality of second nozzles 600 (600b) may be arranged to be spaced apart from each other in the circumferential direction of the wafer W. In addition, when the supply of the assistant liquid is initiated in step S102 of FIG. 8 and when the flow rate of the first processing liquid supplied from the first nozzle 400 is reduced in the next step S103, the supply position of the assistant liquid may be changed by using a separate second nozzle 600 (600b).

Then, a parameter to be adjusted after the supply of the assistant liquid is initiated is not limited to the supply flow rate of the first processing liquid (first flow rate→second flow rate). In addition to the flow rate adjustment, the rotation speed of the wafer W may be reduced so as to suppress the generation of scattering of the processing liquid.

In addition to the aforementioned cases, the forming range of the liquid film L by the first processing liquid supplied from the first nozzle 400 may not be the overall surface of the wafer W. For example, in the case where the processing target region by the first processing liquid is spaced inward from the outer circumferential end of the wafer W, a region outside the processing target region may not be covered with the liquid film L. In such a case, the supply position of the assistant liquid from the second nozzle 600 (600b) is set such that the assistant liquid is supplied at the first flow rate to the peripheral portion of the liquid film L that covers the processing target region.

The kind of the substrate to be processed by the first processing liquid is not limited to the circular semiconductor wafer. For example, the present disclosure may also be applied to the processing unit 16 which performs a liquid processing of an angled glass substrate for a flat panel display. In such a case, in order to form the liquid film L of the first processing liquid on the overall surface of the angled substrate having a dimension varying in a radial direction from the center to the end, for example, the angled substrate may be received in a disc-shaped holder having a recess corresponding to the shape of the angled substrate, and a liquid processing may be performed using the method illustrated in FIGS. 9 to 11.

EXAMPLE (Test) DIW was supplied to the surface of the wafer W rotated around the vertical axis and then the state of a liquid film L that spreads over the surface of the wafer W was observed. In addition, test conditions are represented as values within a predetermined range instead of disclosing specific parameters.

A. Test Condition (Reference Example 1) A wafer W having a diameter of 300 mm was rotated at the rate of rotation N [rpm] within a range of 500 rpm to 1500 rpm, and DIW, which is a first processing liquid, was supplied at a second flow rate $F_2$ within a range of 1.0 l/min to 1.5 l/min Thereafter, DIW, which is an assistant liquid (second processing liquid), was supplied at a flow rate $F_A$ within a range of 0.1 l/min to 0.5 l/min from the second nozzle 600 to the peripheral portion of the liquid film L formed on the surface of the wafer W. Then, the supply position of the assistant liquid from the second nozzle 600 was moved to the peripheral portion of the wafer W in the radial direction while continuing the supply of the DIW from the first nozzle 400 and the second nozzle 600. The contact angle between the wafer W and the DIW is 90°.

Comparative Example 1 Compared to Reference Example 1, the supply of the assistant liquid from the second nozzle 600 was not performed.

Comparative Example 2 With respect to a wafer W under the same condition as Reference Example 1 in terms of the rotation speed and the contact angle, DIW was supplied from three first nozzles 400 to three locations of the central portion, the peripheral portion, and a location between the central portion and the peripheral portion of the wafer W at a flow rate $F_2/3$ for each location (the total flow rate is equal to the second flow rate $F_2$).

B. Test Result

Figure 16:
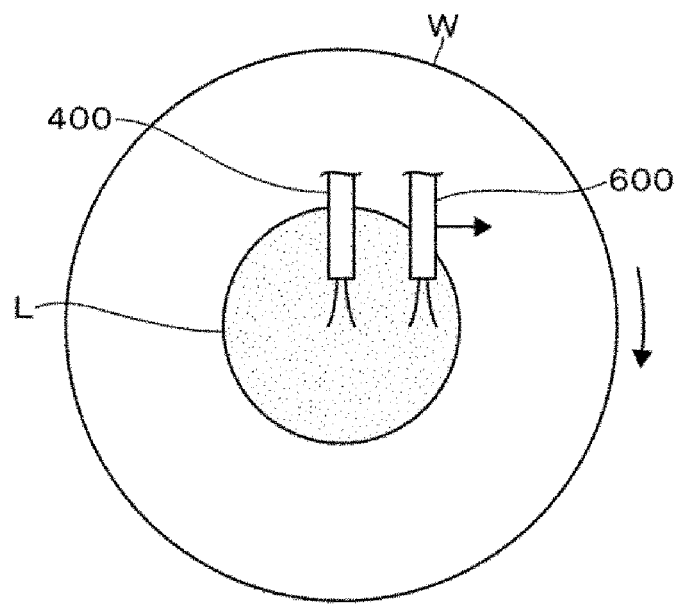
FIG. 16 is a first explanatory view according to Reference Example 1.
Figure 17:
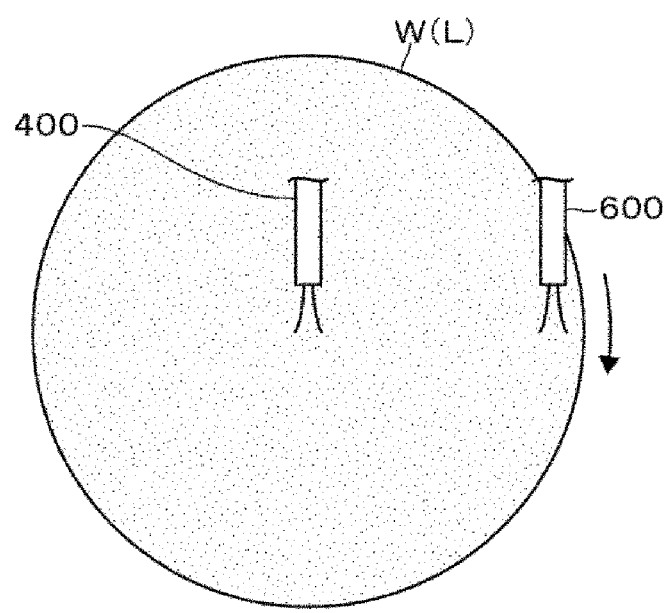
FIG. 17 is a second explanatory view according to Reference Example 1.
Figure 18:
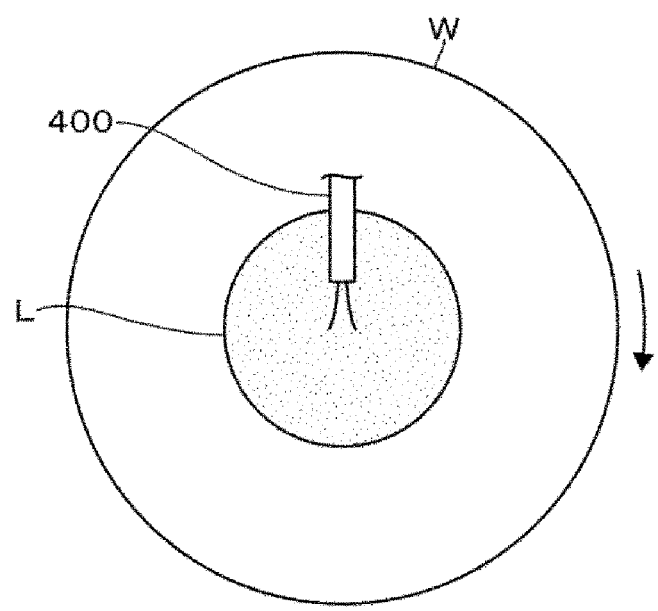
FIG. 18 is an explanatory view according to Comparative Example 1.
Figure 19:
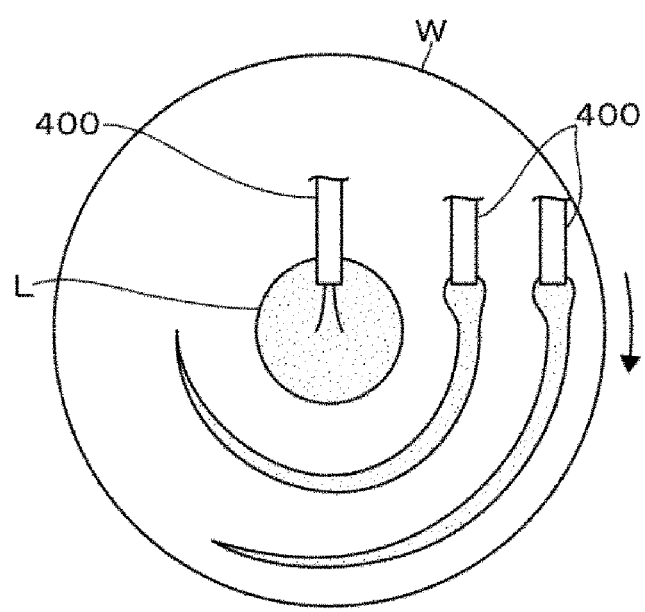
FIG. 19 is an explanatory view according to Comparative Example 2.

Results of Reference Example 1 are illustrated in FIGS. 16 and 17, and results of Comparative Examples 1 and 2 are illustrated in FIGS. 18 and 19, respectively. These drawings diagrammatically illustrate a region at which the liquid film L is formed when the DIW was supplied to the wafer W.

When the DIW was supplied at the second flow rate $F_2$ from the first nozzle 400 alone, the liquid film L was formed only in the region of the central portion of the wafer W. As the DIW, which is the assistant liquid, was supplied at the flow rate $F_A$ from the second nozzle 600 to the peripheral portion of the liquid film L (FIG. 16) and the second nozzle 600 was moved outwardly in the radial direction of the wafer W, the overall surface of the wafer W was covered with the liquid film L even through the supply amount of the DIW from the first nozzle 400 was not increased (FIG. 17).

According to the results of Reference Example 1 illustrated in FIGS. 16 and 17, it can be seen that the state of the liquid film L formed on the overall surface of the wafer W can be maintained even if the flow rate of the DIW supplied from the first nozzle 400 is reduced to the second flow rate $F_2$ by supplying the assistant liquid from the second nozzle 600 to the peripheral portion of the wafer W (the peripheral portion of the liquid film L) after supplying the DIW from the first nozzle 400 alone at the first flow rate $F_1$ which is sufficient to form the liquid film L of the DIW on the overall surface of the wafer W.

In contrast, as illustrated in Comparative Example 1 of FIG. 18, the overall surface of the wafer W was not covered with the liquid film L by simply supplying the DIW at the second flow rate $F_2$ from the first nozzle 400. In addition, as represented by Comparative Example 2 of FIG. 19, even if the DIW is supplied in a dispersed manner to the positions spaced apart from each other in the radial direction of the wafer W from the initiation of the supply of DIW, the DIW supplied to the outer side does not act to attract the liquid film L at the inner side thereof, and the DIW supplied from two first nozzles 400 located at the outer side draws lines that extend in stripe shapes in the rotation direction of the wafer W.

It can be appreciated from the results of Comparative Examples 1 and 2 that the action of causing the liquid film L of first processing liquid to spread over the overall surface of the wafer W cannot be obtained even if the first processing liquid is supplied at the second flow rate $F_2$ to the central portion of the wafer W and the assistant liquid (second processing liquid) is supplied at the flow rate $F_A$ to the peripheral portion of the wafer W from the initiation of the liquid processing. It can be said that the supply flow rate of first processing liquid may be reduced to the second flow rate $F_2$ by supplying the first processing liquid at the first flow rate $F_1$ so as to perform the operations of FIGS. 9 to 11 which supply the assistant liquid in the state where the liquid film L is formed on the overall surface of the wafer W.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate liquid-processing apparatus comprising:
    a substrate holding unit configured to horizontally hold a substrate and to rotate the substrate around a vertical axis;
    a first nozzle including a pipe which supplies a first processing liquid to a central portion of the substrate held by the substrate holding unit;
    a second nozzle including a pipe which supplies a second processing liquid to a location between the central portion and a circumferential end of the substrate; and
    a controller configured to control supply initiation and stop of the first processing liquid from the first nozzle and the supply initiation and stop of the second processing liquid from the second nozzle,
    wherein the controller is configured to execute the supply of the first processing liquid from the first nozzle to the central portion of the rotating substrate at a first flow rate and the supply of the second processing liquid from the second nozzle, and to execute change of a supply flow rate of the first processing liquid, from the first nozzle to the central portion of the substrate, into a second flow rate that is lower than the first flow rate while supplying the second processing liquid to the substrate that is formed with a liquid film on the overall surface thereof, and
    the sum of the second flow rate and a supply flow rate of the second processing liquid is less than the first flow rate.

2. The apparatus according to claim 1, wherein the first processing liquid is supplied to the central portion of the substrate at the first flow rate in a range of about 2.0 L/min to about 2.5 L/min while the substrate is rotated at a rotation speed in a range of about 500 rpm to about 1500 rpm such that the liquid film is formed on the overall surface of the substrate in a state where the second processing liquid is not supplied, and
    the first processing liquid is supplied to the central portion of the substrate at the second flow rate in a range of about 1.0 L/min to about 1.5 L/min while the substrate is rotated at a rotation speed in a range of about 500 rpm to about 1500 rpm such that the liquid film is not formed on the overall surface of the substrate in a state where the second processing liquid is not supplied.

3. The apparatus according to claim 2, wherein the supply position of the second processing liquid at a time of supplying the second processing liquid to the location between the central portion and the outer circumferential end of the substrate by the second nozzle while supplying the first processing liquid to the central portion of the substrate at the first flow rate is a position that causes the second processing liquid to cover an outer circumferential end of the liquid film formed when the first processing liquid is supplied to the substrate at the second flow rate and the second processing liquid is not supplied to the substrate.

4. The apparatus according to claim 1, wherein the second processing liquid is a liquid mixable with the first processing liquid.

5. The apparatus according to claim 4, wherein the first processing liquid and the second processing liquid are pure water.

6. The apparatus according to claim 1, wherein the second processing liquid has a surface tension than that of the first processing liquid.

7. The apparatus according to claim 4, wherein the first processing liquid is pure water, and the second processing liquid is isopropyl alcohol.

8. The apparatus according to claim 1, wherein the second nozzle ejects the second processing liquid along a tangential direction of a rotation circle from an upstream side toward a downstream side of a rotation circle, the rotation circle rotating around the vertical axis in the same direction as the substrate, and the second nozzle is disposed such that an angle between the ejecting direction and the surface of the substrate is within a range of 5° to 15° when viewed from a lateral side.

9. The apparatus according to claim 8, wherein the second nozzle ejects the second processing liquid outwardly in a radial direction of the rotation circle and is supplied to the substrate such that an angle between the supply direction of the second processing liquid and the tangential direction is within a range of 0° to 45° when viewed from an upper side.

10. A substrate liquid-processing apparatus comprising:
    a substrate holding unit configured to horizontally hold a substrate and to rotate the substrate around a vertical axis;
    a first nozzle including a pipe which supplies a first processing liquid being pure water to a central portion of the substrate held by the substrate holding unit;
    a second nozzle including a pipe which supplies a second processing liquid being isopropyl alcohol to a location between the central portion and a circumferential end of the substrate; and
    a controller configured to control supply initiation and stop of the first processing liquid from the first nozzle and the supply initiation and stop of the second processing liquid from the second nozzle,
    wherein the controller is configured to execute the supply of the first processing liquid from the first nozzle to the central portion of the rotating substrate at a first flow rate and the supply of the second processing liquid from the second nozzle, and to execute change of a supply flow rate of the first processing liquid, from the first nozzle to the central portion of the substrate, into a second flow rate that is lower than the first flow rate while supplying the second processing liquid to the substrate that is formed with a liquid film on the overall surface thereof, and
    the first processing liquid is pure water, and the second processing liquid is isopropyl alcohol.

11. A substrate liquid-processing apparatus comprising:
a substrate holding unit configured to horizontally hold a substrate and to rotate the substrate around a vertical axis;
a first nozzle including a pipe which supplies a first processing liquid to a central portion of the substrate held by the substrate holding unit;
a second nozzle including a pipe which supplies a second processing liquid to a location between the central portion and a circumferential end of the substrate; and
a controller configured to control supply initiation and stop of the first processing liquid from the first nozzle and the supply initiation and stop of the second processing liquid from the second nozzle,
wherein the controller is configured to execute the supply of the first processing liquid from the first nozzle to the central portion of the rotating substrate at a first flow rate and the supply of the second processing liquid from the second nozzle, and to execute change of a supply flow rate of the first processing liquid, from the first nozzle to the central portion of the substrate, into a second flow rate that is lower than the first flow rate while supplying the second processing liquid to the substrate that is formed with a liquid film on the overall surface thereof, and
the second nozzle ejects the second processing liquid along a tangential direction of a rotation circle from an upstream side toward a downstream side of a rotation circle, the rotation circle rotating around the vertical axis in the same direction as the substrate, and the second nozzle is disposed such that an angle between the ejecting direction and the surface of the substrate is within a range of 5° to 15° when viewed from a lateral side.

12. The apparatus according to claim 11, wherein the second nozzle ejects the second processing liquid outwardly in a radial direction of the rotation circle and is supplied to the substrate such that an angle between the supply direction of the second processing liquid and the tangential direction is within a range of 0° to 45° when viewed from an upper side.

* * * * *